(12) United States Patent
Ishiwata

(10) Patent No.: US 7,803,500 B2
(45) Date of Patent: Sep. 28, 2010

(54) PHOTOMASK, PHOTOMASK FABRICATION METHOD, AND SEMICONDUCTOR DEVICE FABRICATION METHOD

(75) Inventor: Naoyuki Ishiwata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 954 days.

(21) Appl. No.: 11/154,531

(22) Filed: Jun. 17, 2005

(65) Prior Publication Data
US 2006/0177743 A1 Aug. 10, 2006

(30) Foreign Application Priority Data
Feb. 8, 2005 (JP) .............................. 2005-031676

(51) Int. Cl.
*G03F 1/00* (2006.01)
(52) U.S. Cl. ............................................. 430/5; 430/22
(58) Field of Classification Search .................... 430/5, 430/22, 30, 311, 322; 355/53, 55
See application file for complete search history.

(56) References Cited

U.S. PATENT DOCUMENTS

| 5,723,236 A * | 3/1998 | Inoue et al. ..................... 430/5 |
| 2002/0006555 A1 * | 1/2002 | Hasegawa et al. .............. 430/5 |
| 2002/0034694 A1 * | 3/2002 | Tanaka et al. ................... 430/5 |
| 2003/0148635 A1 * | 8/2003 | Hasegawa et al. ........... 438/942 |
| 2005/0112475 A1 * | 5/2005 | Sato et al. ....................... 430/5 |

FOREIGN PATENT DOCUMENTS

| JP | 09-050116 A | 2/1997 |
| JP | 2002-182367 | 6/2002 |

OTHER PUBLICATIONS

"Japanese Office Action", Partial English Translation, mailed Mar. 24, 2009 in reference to corresponding JP App. No. 2005-031676.

* cited by examiner

*Primary Examiner*—Mark F Huff
*Assistant Examiner*—Stewart A Fraser
(74) *Attorney, Agent, or Firm*—Fujitsu Patent Center

(57) ABSTRACT

A photomask capable of preventing a pattern outside a chip region from being transferred onto a wafer. A non-circuit pattern (a monitor pattern for measuring the accuracy of the position of a mask pattern, for example) formed by making openings in which a phase shift layer is exposed only in a light shielding layer is located around the chip region where the light shielding layer is removed and where the phase shift layer in which openings corresponding to circuit patterns are made is exposed. This prevents the non-circuit pattern from being transferred onto the wafer by the influence of a flare.

17 Claims, 14 Drawing Sheets

FIG. 12(A)  *PRIOR ART*
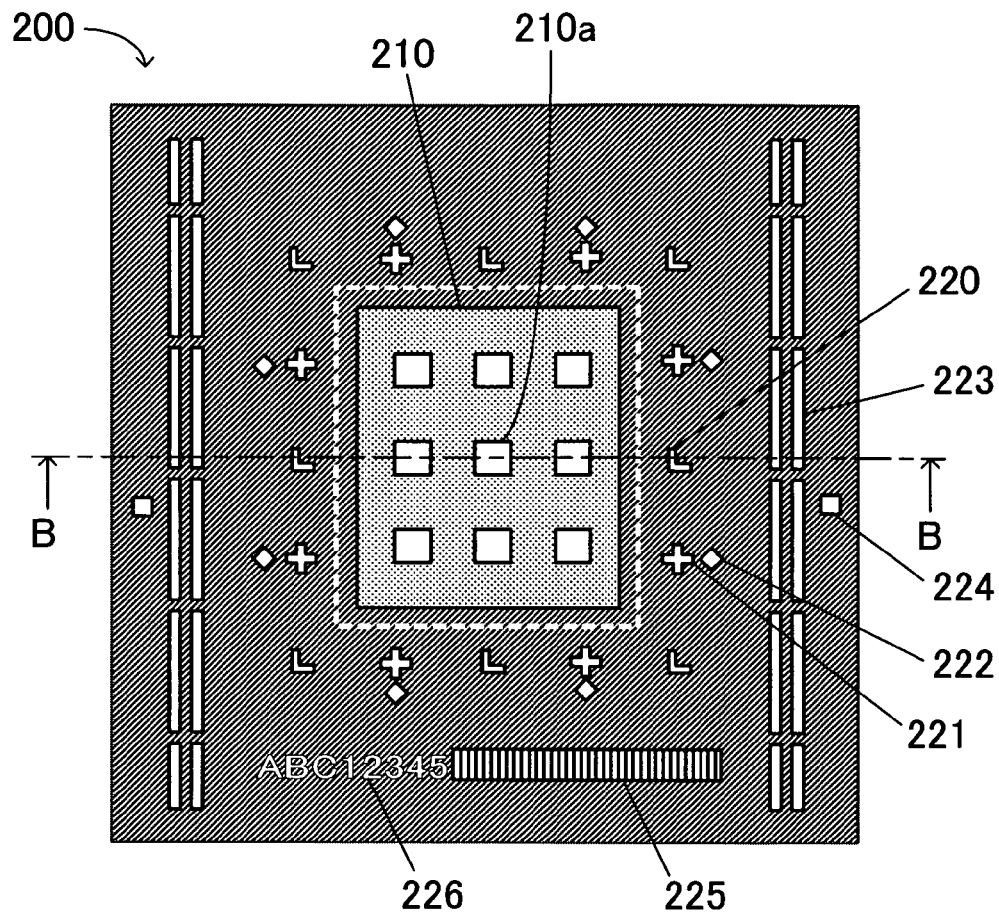
FIG. 12(B)  *PRIOR ART*
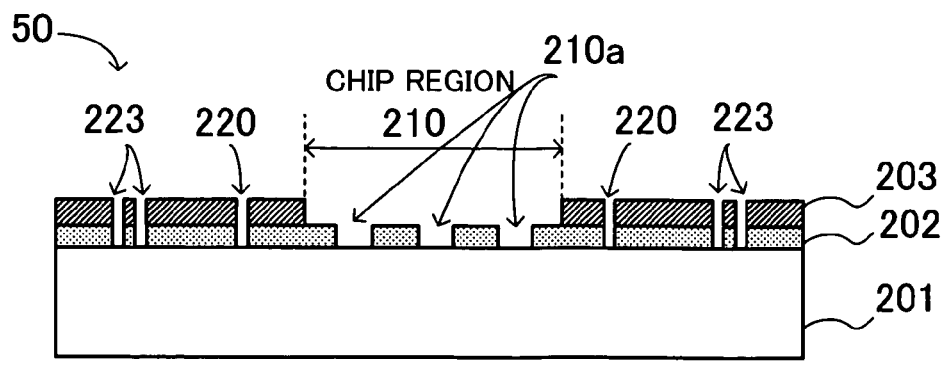

FIG. 13(A)  *PRIOR ART*
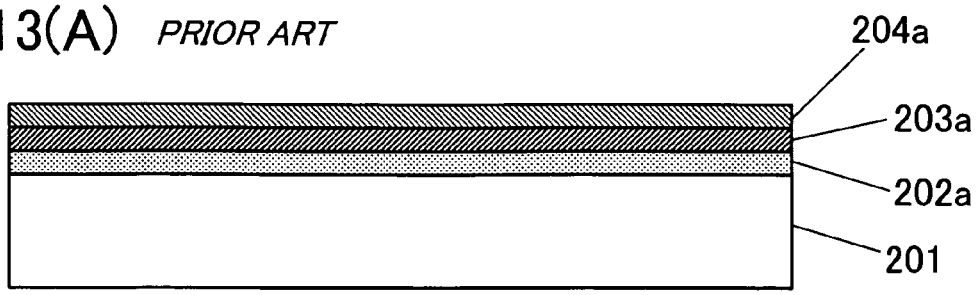
FIG. 13(B)  *PRIOR ART*
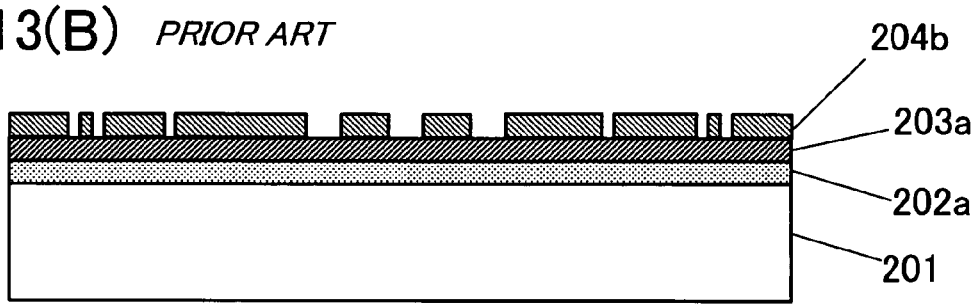
FIG. 13(C)  *PRIOR ART*
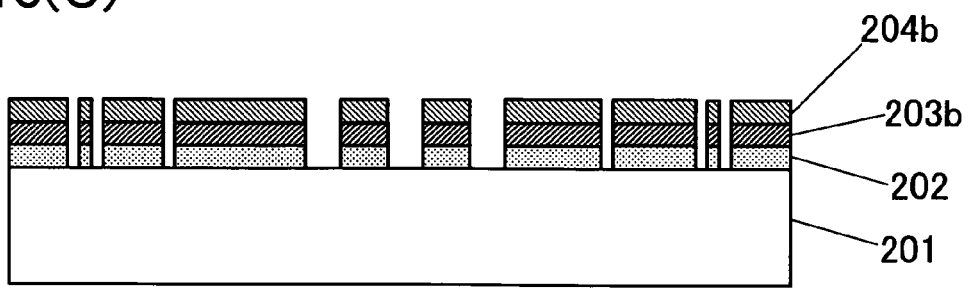
FIG. 13(D)  *PRIOR ART*
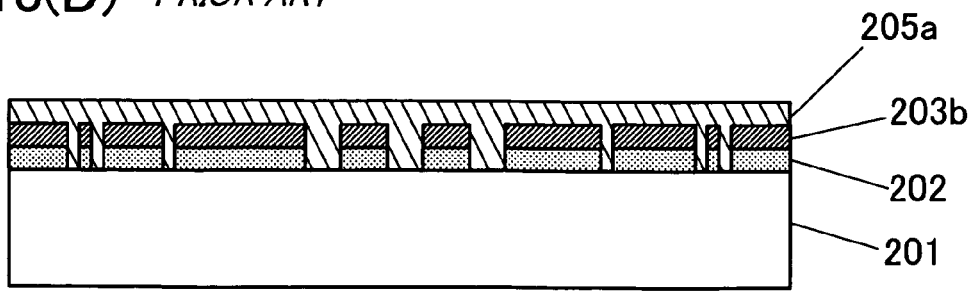

PHOTOMASK, PHOTOMASK FABRICATION METHOD, AND SEMICONDUCTOR DEVICE FABRICATION METHOD

CROSS-REFERENCE TO RELATED APPLICATIONS

This application is based upon and claims the benefits of priority from the prior Japanese Patent Application No. 2005-031676, filed on Feb. 8, 2005, the entire contents of which are incorporated herein by reference.

BACKGROUND OF THE INVENTION (1) Field of the Invention

This invention relates to a photomask, a photomask fabrication method, and a semiconductor device fabrication method and, more particularly, to a photomask having the function of shifting the phase of exposure light, a method for fabricating such a photomask, and a method for fabricating a semiconductor device by the use of such a photomask.

(2) Description of the Related Art

In recent years the formation of very fine patterns has been needed for manufacturing large-scale integrated circuits (LSIs). Accordingly, photomasks (phase shift masks) having the function of heightening contrast by shifting the phase of exposure light are used in exposure processes in which a fine circuit pattern is transferred onto a semiconductor substrate (wafer). In particular, phase shift masks of a halftone type are widely used at present for manufacturing devices because of, for example, easiness of fabrication.

FIGS. 12(A) and 12(B) show the structure of a conventional typical phase shift mask of a halftone type. FIG. 12(A) is a top view of a conventional typical phase shift mask of a halftone type. FIG. 12(B) is a sectional view taken along the line B-B of FIG. 12(A).

A conventional phase shift mask 200 of a halftone type comprises a semitransparent halftone phase shift layer (phase shift layer) 202 and a light shielding layer 203 which are formed in order on a transparent substrate (synthetic silica substrate, for example) 201. In a chip region 210 where circuit patterns 210a transferred onto a semiconductor chip (chip) are to be formed, the light shielding layer 203 is removed and the phase shift layer 202 in which openings corresponding to the circuit patterns 210a to be formed are made is exposed. In an exposure process, there is no change in the phase of exposure light which passes through areas in the chip region 210 where the transparent substrate 201 is exposed, and the phase of exposure light which passes through areas in the chip region 210 where the phase shift layer 202 is exposed is inverted.

On the other hand, the light shielding layer 203 is left in a region outside the chip region 210 so that when the circuit patterns are transferred onto a wafer, multiplex exposure will not be performed on adjacent chips (see, for example, Japanese Unexamined Patent Publication No. 2002-182367, paragraphs [0022]-[0027]and FIG. 1). Various patterns are also formed in this region. For example, a monitor pattern 220 for measuring the accuracy of the position of the circuit patterns 210a, a target pattern 221 for performing alignment at overlay drawing time in the process for fabricating the phase shift mask 200 with a mask drawing apparatus, a pattern 222 for measuring alignment accuracy used at overlay drawing time, a fiducial pattern 223 for adjusting the relative positions of the phase shift mask 200 and an exposure system (stepper or scanner), a pattern 224 for performing alignment at the time of inspecting the circuit patterns 210a for a defect (or for performing alignment at the time of measuring the line width of the circuit patterns 210a), a bar code pattern 225 for mask identification, and a numbering pattern 226 for mask identification are formed.

Next, a method for fabricating a conventional phase shift mask will be described.

FIGS. 13(A), 13(B), 13(C), and 13(D) and FIGS. 14(A), 14(B), and 14(C) are sectional views each showing one step included in a method for fabricating a conventional phase shift mask.

First, a phase shift layer 202a, a light shielding layer 203a, and a resist layer 204a are formed on a transparent substrate 201 in that order (FIG. 13(A)).

Exposure and development are then performed on the resist layer 204a to form a desired resist pattern 204b (FIG. 13(B)). After that, the light shielding layer 203a and the phase shift layer 202a are etched in order to form a light shielding layer 203b and a phase shift layer 202 in each of which openings corresponding to the resist pattern 204b are made (FIG. 13(C)).

The resist pattern 204b is removed. and a resist layer 205a is formed again (FIG. 13(D)).

After the resist layer 205a is formed, exposure and development are performed on the resist layer 205a to form a resist pattern 205b in which an opening is made in a chip region 210 (FIG. 14(A)).

The light shielding layer 203b which is exposed in the chip region 210 is etched to form a light shielding layer 203 in which an opening is made in the chip region 210 (FIG. 14(B)). Lastly, the resist pattern 205b is removed and the phase shift mask 200 is completed (FIG. 14(C)).

When the circuit patterns are transferred onto a wafer by using the conventional phase shift mask, blinds of an exposure system prevent light from leaking out of the chip region. However, a pattern outside the chip region is transferred onto the wafer by the influence of a flare produced by reflection by a lighting system and lenses of the exposure system and the phase shift mask.

If the conventional phase shift mask of a halftone type is used, a resist layer in the entire chip region is slightly exposed. Accordingly, if the influence of a flare is added, an abnormality tends to occur in circuit patterns formed on the wafer.

The patterns, such as the monitor pattern, located outside the chip region are necessary for fabricating the phase shift mask, except the fiducial pattern for adjusting the relative positions of the phase shift mask and the exposure system. Therefore, these patterns must characteristically be located. as close. to the chip region as possible (the validity of a guarantee deteriorates with an increase in the distance from the chip region). However, locating these patterns close to the chip region increases the possibility that they are transferred onto the wafer by the influence of a flare.

SUMMARY OF THE INVENTION

The present invention was made under the background circumstances described above. An object of the present invention is to provide a photomask which can prevent a pattern outside a chip region from being transferred onto a wafer.

Another object of the present invention is to provide a method for fabricating such a photomask.

Still another object of the present invention is to provide a method for fabricating a semiconductor device by using such a photomask.

In order to achieve the above first object, a photomask comprising a transparent substrate, a phase shift layer for shifting a phase of exposure light on the transparent substrate, a light shielding layer on the phase shift layer, circuit patterns by making openings of desired shapes to be transferred onto a semiconductor chip formed on a chip region, and a non-circuit pattern by making openings of desired shapes formed outside the chip region is provided. On this photomask, the light shielding layer is removed in the chip region, the phase shift layer in which openings corresponding to the circuit patterns are made is exposed in the chip region, and the non-circuit pattern is formed around the chip region by making openings in which the phase shift layer is exposed only in the light shielding layer.

In order to achieve the above second object, a method for fabricating a photomask having the function of shifting a phase of exposure light is provided. This method comprises the steps of forming a phase shift layer for shifting a phase of exposure light and a light shielding layer in order on a transparent substrate; forming openings having the shapes of circuit patterns in a chip region transferred onto a semiconductor chip and a non-circuit pattern outside the chip region in the light shielding layer; forming a resist pattern in which an opening is made in the chip region and which covers the opening around the chip region having the shape of the non-circuit pattern, and etching the phase shift layer with the resist pattern and the light shielding layer which is exposed in the chip region as masks; and removing the light shielding layer in the chip region.

In order to achieve the above third object, a method for fabricating a semiconductor device is provided. This method comprises an exposure step where exposure is performed by using a photomask comprising a transparent substrate, a phase shift layer for shifting a phase of exposure light on the transparent substrate, a light shielding layer on the phase shift layer, circuit patterns by making openings of desired shapes to be transferred onto a semiconductor chip formed on. a chip region, and a non-circuit pattern by making openings of desired shapes formed outside the chip region, in the chip region on the photomask the light shielding layer being removed and the phase shift layer in which openings corresponding to the circuit patterns are made being exposed, the non-circuit pattern being formed around the chip region on the photomask by making openings in which the phase shift layer is exposed only in the light shielding layer.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 12(A) and 12(B) show the structure of a conventional typical phase shift mask of a halftone type, FIG. 12(A) being a top view of a conventional typical phase shift mask of a halftone type, FIG. 12(B) being a sectional view taken along the line B-B of FIG. 12(A).

FIGS. 13(A), 13(B), 13(C), and 13(D) are sectional views each showing one step included in a method (I) for fabricating the conventional phase shift mask.

DESCRIPTION OF THE PREFERRED EMBODIMENTS

Embodiments of the present invention will now be described in detail with reference to the drawings.

Figure 1A:
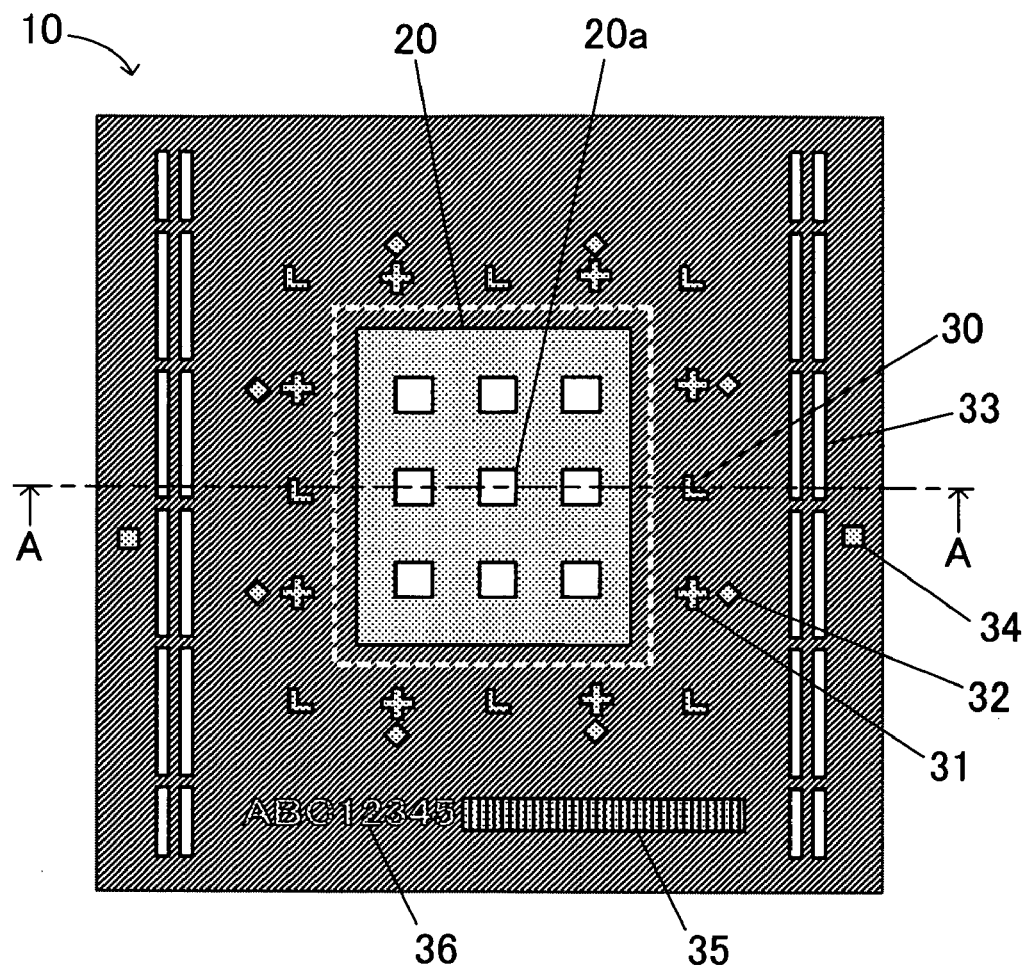
FIGS. 1(A) and 1(B) show the structure of a phase shift mask according to an embodiment of the present invention, FIG. 1(A) being a top view of the phase shift mask, FIG. 1(B) being a sectional view taken along the line A-A of FIG. 1(A).
Figure 1B:
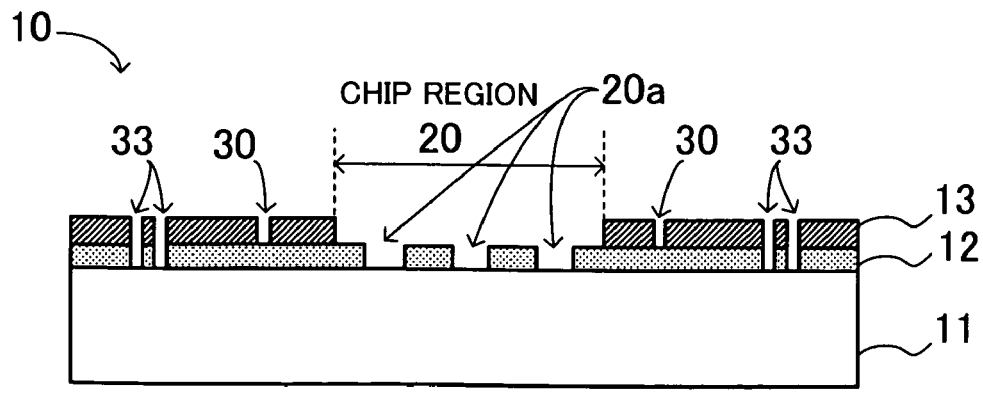

FIGS. 1(A) and 1(B) show the structure of a phase shift mask according to an embodiment of the present invention. FIG. 1(A) is a top view of the phase shift mask. FIG. 1(B) is a sectional view taken along the line A-A of FIG. 1(A).

A phase shift mask 10 according to an embodiment of the present invention includes a phase shift layer 12 and a light shielding layer 13 formed in order on a transparent substrate 11. By making openings of desired shapes, patterns are formed on the phase shift mask 10.

The transparent substrate 11 is, for example, a synthetic silica substrate. Each of the phase shift layer 12 and the light shielding layer 13 can be etched selectively. For example, the phase shift layer 12 is made of MoSiON and the light shielding layer 13 is made up of a chromium film and a chromium oxide film. If the transmittance of the transparent substrate 11 is 100%, that of the phase shift layer 12 is about 6%.

In a chip region 20 where circuit patterns 20a which are included in patterns formed on the phase shift mask 10 and which are transferred onto a chip are to be formed, the light shielding layer 13 is removed and the phase shift layer 12 where openings corresponding to the circuit patterns 20a to be formed are made is exposed. There is no change in the phase of exposure light which passes through areas in the chip region 20 where the transparent substrate 11 is exposed, and the phase of exposure light which passes through areas in the chip region 20 where the phase shift layer 12 is exposed is inverted.

The light shielding layer 13 is left in an area outside the chip region 20 so that when the circuit patterns 20a are transferred onto a wafer, multiplex exposure will not be performed on adjacent chips. Various patterns are also formed in this area. For example, a monitor pattern 30 for measuring the accuracy of the position of the circuit patterns 20a, a target pattern 31 for performing alignment at the time of overlay-drawing the phase shift layer 12 and the light shielding layer 13 in a mask drawing apparatus, a pattern 32 for measuring alignment accuracy used in the mask drawing apparatus at overlay drawing time, a fiducial pattern 33 for adjusting the relative positions of the phase shift mask and an exposure system, a pattern 34 for performing alignment at the time of inspecting the circuit patterns 20a for a defect (or for performing alignment at the time of measuring the line width of the circuit patterns 20a), a bar code pattern 35 for mask identification, and a numbering pattern 36 for mask identification are formed.

On the phase shift mask 10 according to this embodiment of the present invention, part of these patterns located around the chip region 20 are formed so that openings will be made only in the light shielding layer 13 and so that the phase shift layer 12 will be exposed in the openings. In FIG. 1, the phase shift layer 12 is exposed in the openings made in the above-mentioned patterns except the fiducial pattern 33 through which exposure light must be made to pass for adjusting the relative positions of the phase shift mask 10 and the exposure system.

The monitor pattern 30, the target pattern 31 for performing alignment and, the pattern 32 for measuring alignment accuracy are characteristically located close to the chip region 20. Accordingly, when the circuit patterns 20a are transferred onto a wafer, a flare tends to influence them. As stated above, however, the influence of a flare on them can be reduced by leaving the phase shift layer 12 in openings made in these patterns. This prevents these patterns from being transferred onto a wafer.

Experiments show that the influence of a flare is slight in areas over 15 mm distant from the chip region 20. The influence of a flare is significant in an exposure process in which a sensitive resist is used with an ArF exima laser as a light source. However, a flare is caused by a multiple reflection phenomenon which occurs in an exposure optical system in an exposure apparatus. Therefore, the influence of a flare is also shown in an exposure apparatus using a KrF laser as a light source. In the above example, the phase shift layer 12 is left in the openings made in all of the patterns outside the chip region 20 except the fiducial pattern 33. However, the phase shift layer 12 may be left only in openings made in patterns which are within fifteen millimeters of the chip region 20.

The light shielding layer 13 has been removed in the openings in the patterns where the phase shift layer 12 is left, and there are differences in level. Accordingly, these patterns can be detected by reflected light and be used in the same manner as before.

A phase shift mask fabrication method according to an embodiment of the present invention will now be described.

FIGS. 2(A), 2(B), 2(C), and 2(D) and FIGS. 3(A), 3(B), 3(C), and 3(D) are sectional views each showing one step included in a method for fabricating the phase shift mask according to the embodiment of the present invention.

Figure 2A:
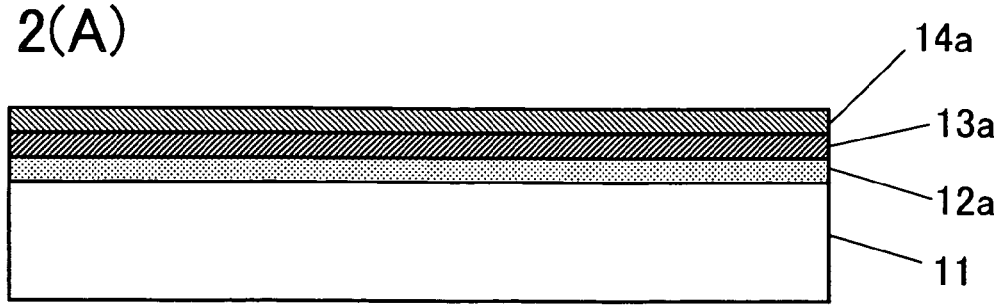
FIGS. 2(A), 2(B), 2(C), and 2(D) are sectional views each. showing one step included in a method (I) for fabricating the phase shift mask according to the embodiment of the present invention.

First, a phase shift layer 12a made of, for example, a MoSiON film and a light shielding layer 13a made up of, for example, a chromium film and a chromium oxide film are formed in order on the transparent substrate 11 made of, for example, synthetic silica and a resist layer 14a is formed by a spin coat method (FIG. 2(A)).

Figure 2B:
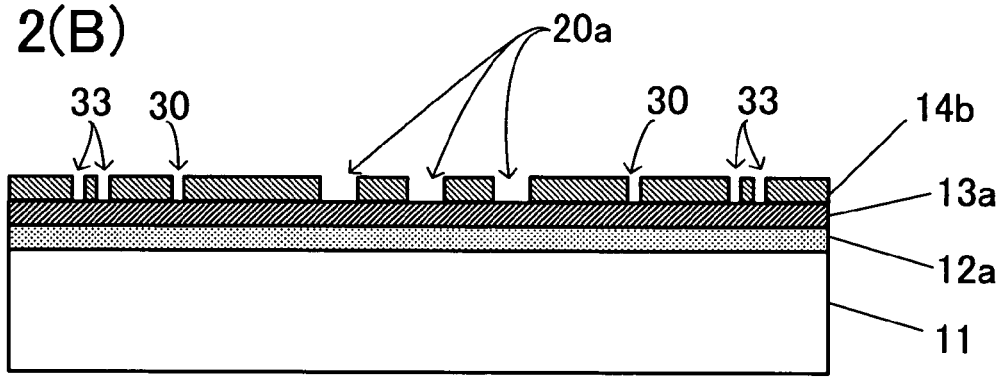

Exposure and development are then performed on the resist layer 14a with, for example, a mask drawing apparatus using an electron beam to form a resist pattern 14b in which openings having the shapes of the circuit patterns 20a in the chip region 20 and the various patterns outside the chip region 20 shown in FIG. 1 are made (FIG. 2(B)).

Figure 2C:
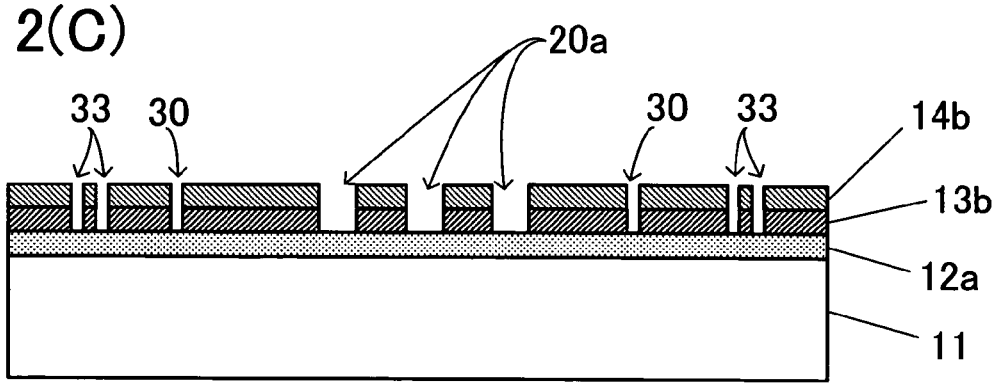

After that, only the light shielding layer 13a is selectively etched by, for example, dry etching with the resist pattern 14b as an etching mask to form a light shielding layer 13b in which openings corresponding to the resist pattern 14b are made (FIG. 2(C)).

Figure 2D:
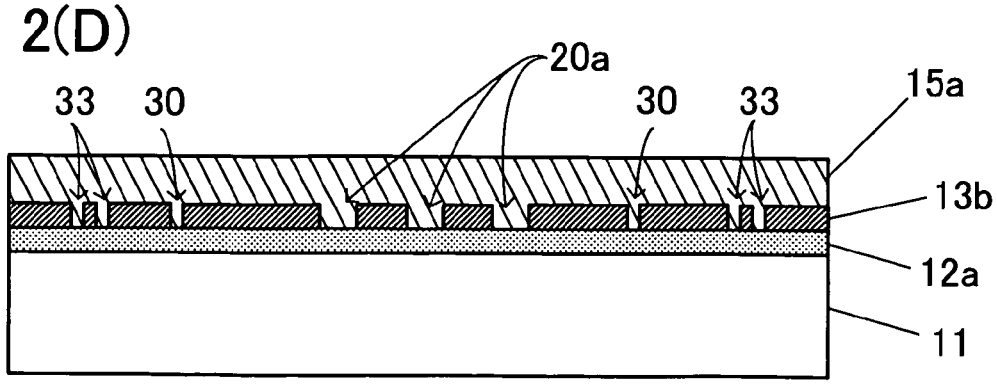

The residual resist pattern 14b is removed and a resist layer 15a is formed again (FIG. 2(D)).

Exposure and development are then performed on the resist layer 15a to form a resist pattern 15b. Openings having the shapes of the whole of the chip region 20 in FIG. 1 and the fiducial pattern 33 in FIG. 1 which needs high light transmittance and which must be formed as a light transmission portion are made in the resist pattern 15b. The resist pattern 15b covers the openings having the shapes of the other patterns, such as the monitor pattern 30, located outside the chip region 20. In this case, portions of the light shielding layer 13b corresponding to the fiducial pattern 33 preferably is not damaged. Therefore, alignment of the resist pattern 15b with the light shielding layer 13b must be performed strictly (FIG. 3(A)).

After the resist pattern 15b is formed, the phase shift layer 12a is etched with the resist pattern 15b and the light shielding layer 13b which is exposed in the chip region 20 as etching masks. As a result, the phase shift layer 12 in which openings having the shapes of the circuit patterns 20a formed in the chip region 20 and the fiducial pattern 33 formed outside the chip region 20 are made is formed. All of the openings in the light shielding layer 13b which are located around the chip region 20 and which have the shapes of the patterns except the fiducial pattern 33 are covered with the resist pattern 15b, so the corresponding phase shift layer 12 is not etched and remains (FIG. 3(B)).

Figure 3A:
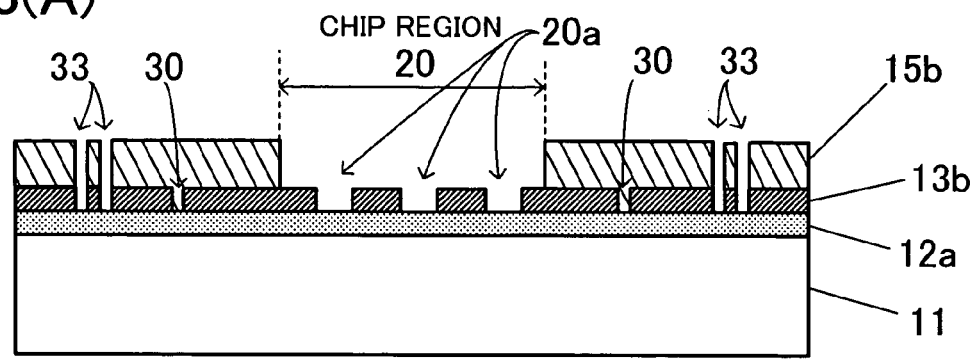
FIGS. 3(A), 3(B), 3(C), and 3(D) are sectional views each showing one step included in a method (II) for fabricating the phase shift mask according to the embodiment of the present invention.
Figure 3B:
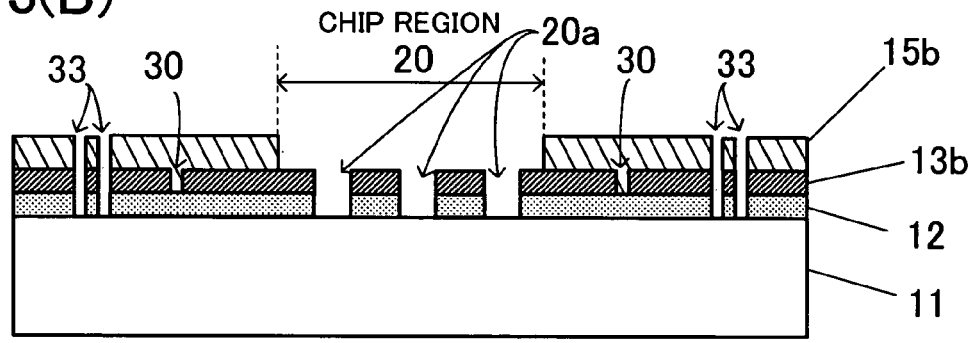
Figure 3C:
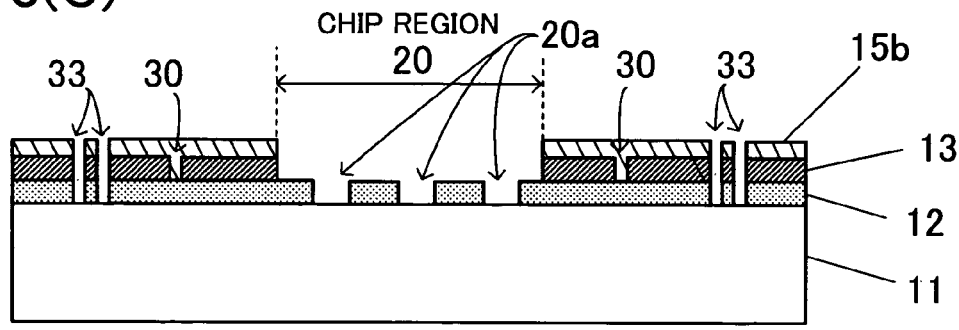

The light shielding layer 13b which is exposed in the chip region 20 is then etched with the residual resist pattern 15b as an etching mask (FIG. 3(C)).

Figure 3D:
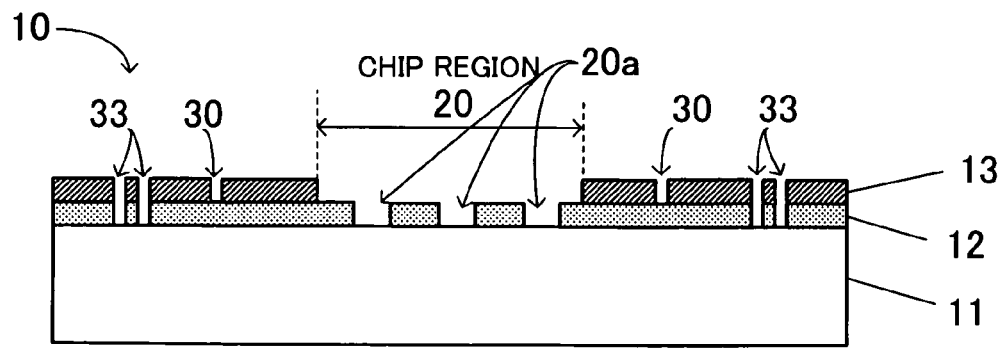

Finally, the residual resist pattern 15b is removed to complete the phase shift mask 10 (FIG. 3(D)).

With the above method for fabricating the phase shift mask 10, attention must be paid to damage to the portions of the light shielding layer 13 corresponding to the fiducial pattern 33. However, the fabrication process is almost the same as that of the conventional phase shift mask of a halftone type. A phase shift mask of a halftone type with higher reliability can be provided without increasing the number of the steps or raising the costs.

Another method for fabricating the phase shift mask 10 of a halftone type will now be described.

FIGS. 4(A), 4(B), and 4(C) and FIGS. 5(A), 5(B), and 5(C) are sectional views each showing one step included in another method for fabricating the phase shift mask according to the embodiment of the present invention.

Components which are the same as those shown in FIG. 2(A), 2(B), 2(C), or 2(D) or FIG. 3(A), 3(B), 3(C), or 3(D) are marked with the same symbols. The same steps that are shown in FIGS. 2(A), 2(B), 2(C), and 2(D) are also performed in the following fabrication method, so steps performed after them will be described.

After a resist layer 15a is formed, exposure and development are performed on the resist layer 15a to form a resist pattern 15c. In the resist pattern 15c, openings are made in predetermined areas including the fiducial pattern 33 to be formed outside the chip region 20 which is shown in FIG. 1. The resist pattern 15c covers the openings having the shapes of the other patterns, such as the monitor pattern 30. There is no need to make openings having the shape of the fiducial pattern 33 in the resist pattern 15c. Therefore, strict alignment of the resist pattern 15c with the light shielding layer 13b is unnecessary (FIG. 4(A)).

After the resist pattern 15c is formed, the phase shift layer 12a is etched with the resist pattern 15c and the exposed light shielding layer 13b as etching masks. As a result, the phase shift layer 12 in which openings having the shapes of the circuit patterns 20a formed in the chip region 20 and the fiducial pattern 33 formed outside the chip region 20 are made is formed. All of the openings in the light shielding layer 13b which are located outside the chip region 20 and which have the shapes of the patterns except the fiducial pattern 33 are covered with the resist pattern 15c, so the corresponding phase shift layer 12 is not etched and remains (FIG. 4(B)).

Figure 4A:
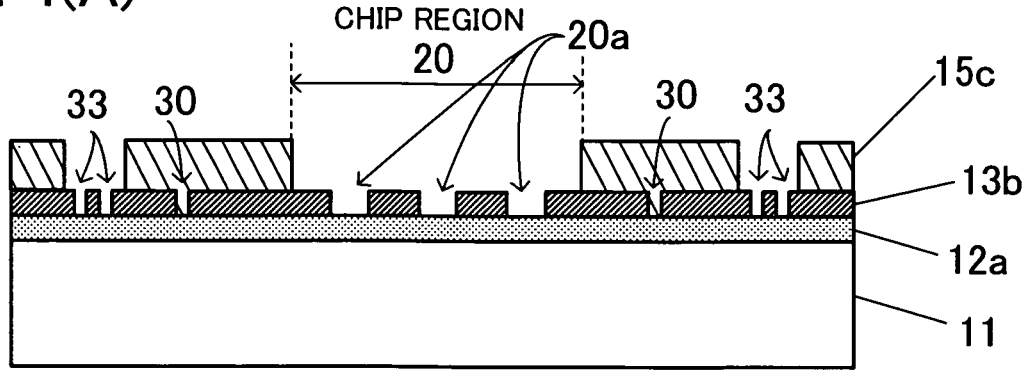
FIGS. 4(A), 4(B), and 4(C) are sectional views each showing one step included in another method (I) for fabricating the phase shift mask according to the embodiment of the present invention.
Figure 4B:
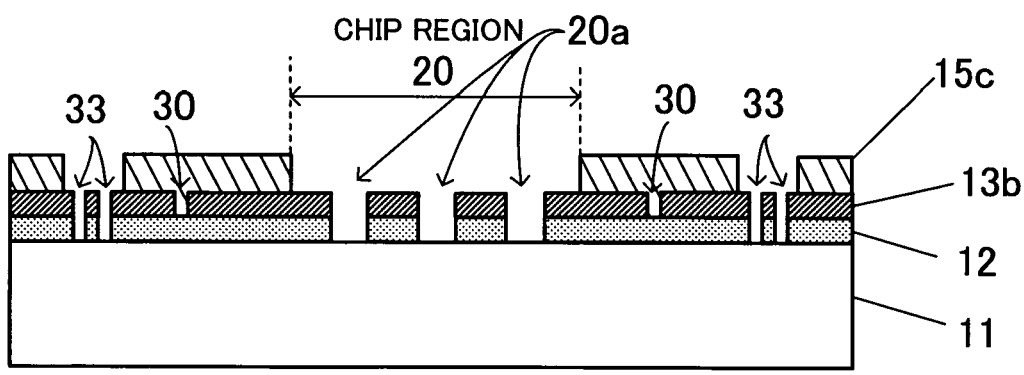
Figure 4C:
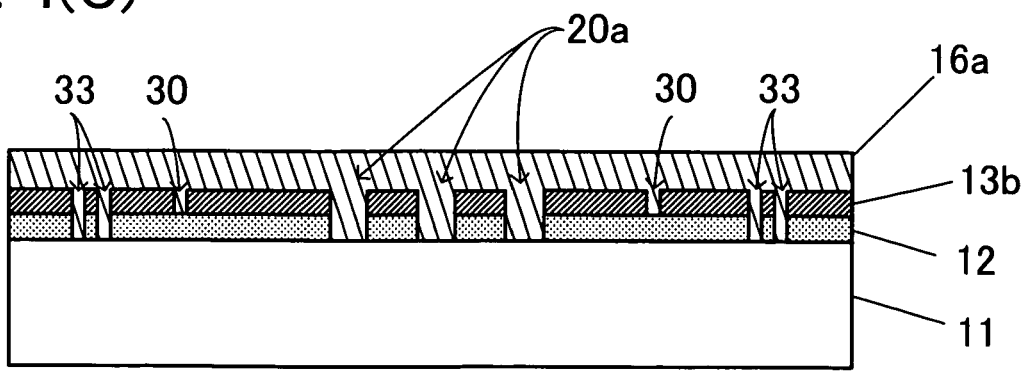

The residual resist pattern 15c is then removed and a resist layer 16a is formed again (FIG. 4(C)).

Figure 5A:
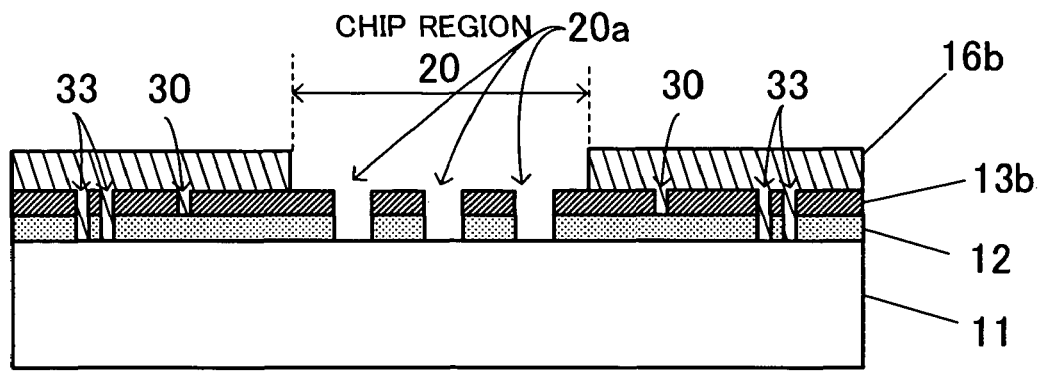
FIGS. 5(A), 5(B), and 5(C) are sectional views each showing one step included in another method (II) for fabricating the phase shift mask according to the embodiment of the present invention.

Exposure and development are performed on the resist layer 16a to form a resist pattern 16b in which an opening is made in the entire chip region 20 (FIG. 5(A)).

Figure 5B:
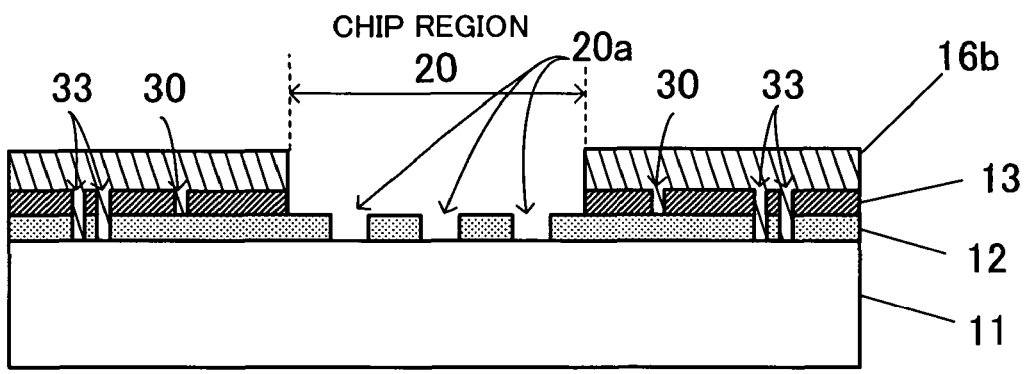

The light shielding layer 13b which is exposed in the chip region 20 is etched with the resist pattern 16b as an etching mask (FIG. 5(B)).

Figure 5C:
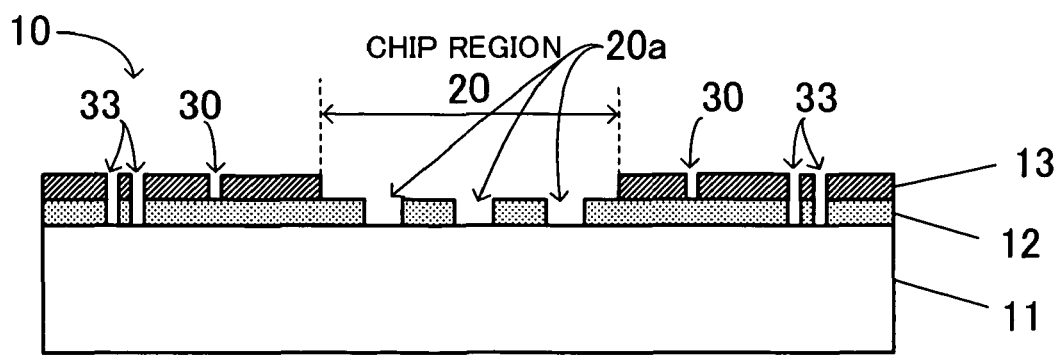

Finally, the resist pattern 16b is removed to complete the phase shift-mask 10 (FIG. 5(C)).

Compared with the first fabrication method, the number of times an overlay exposure is performed increases by one. However, this fabrication method prevents the above damage to a portion of the light shielding layer 13 corresponding to the fiducial pattern 33 and therefore the high-quality phase shift mask 10 with high reliability can be provided.

An example of using the phase shift mask 10 according to the embodiment of the present invention for fabricating an actual semiconductor device will now be described.

FIGS. 6(A) and 6(B), FIGS. 7(A) and 7(B), FIGS. 8(A) and 8(B), FIGS. 9(A) and 9(B), FIGS. 10(A) and 10(B), and FIG. 11(A) and 11(B) are sectional views each showing one step included in a semiconductor device fabrication method.

Figure 6A:
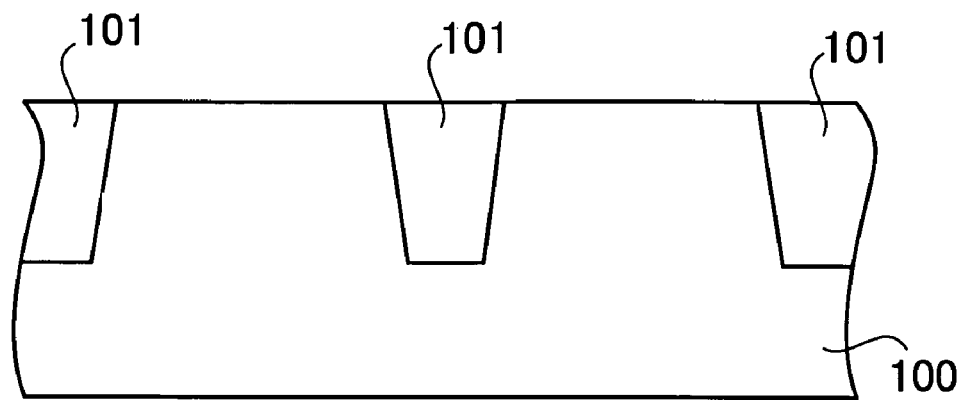
FIGS. 6(A) and 6(B) are sectional views each showing one step included in a semiconductor device fabrication method (I).
Figure 6B:
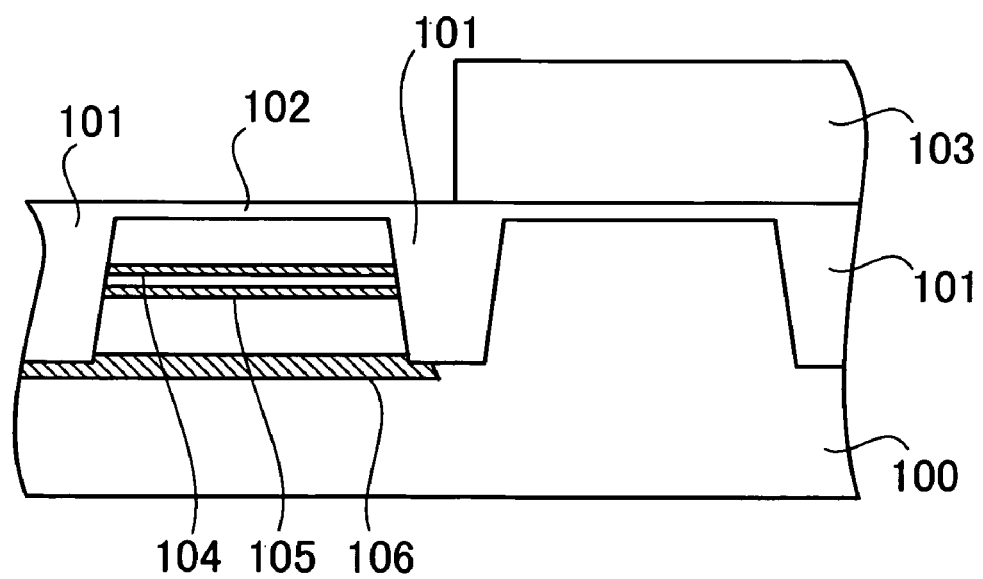
Figure 7A:
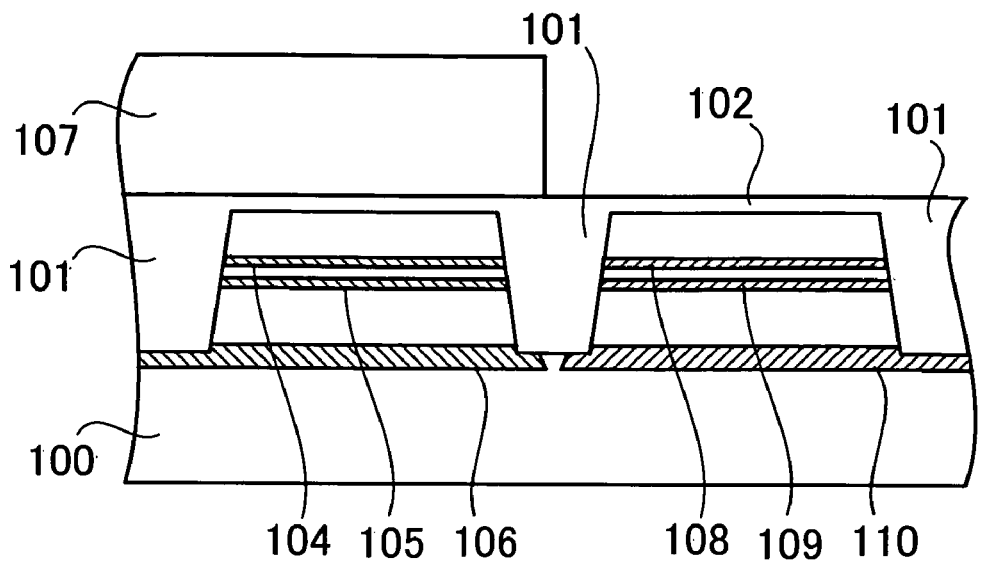
FIGS. 7(A) and 7(B) are sectional views each showing one step included in a semiconductor device fabrication method (II).
Figure 7B:
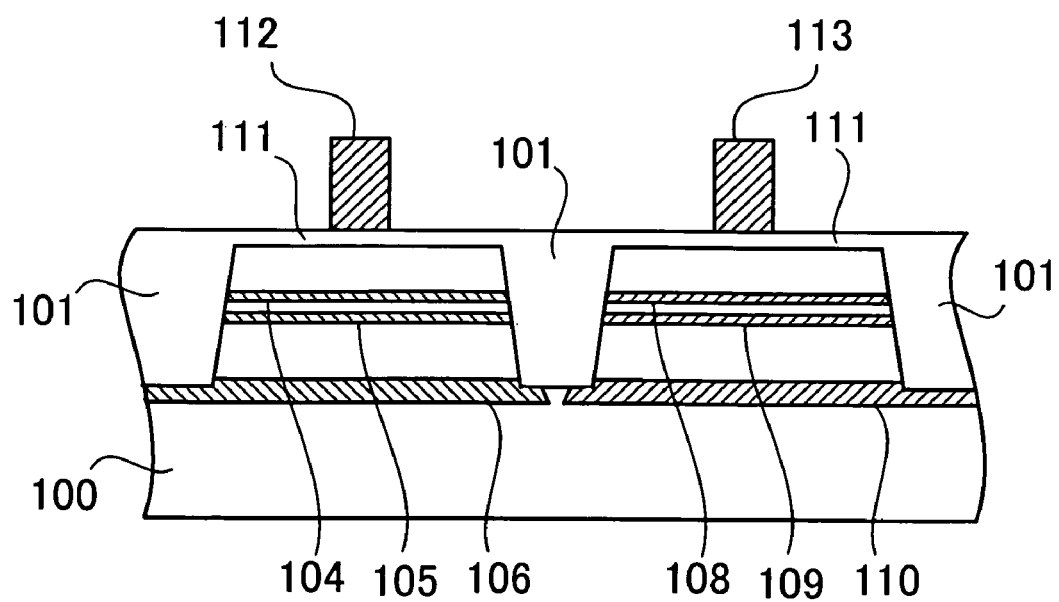
Figure 8A:
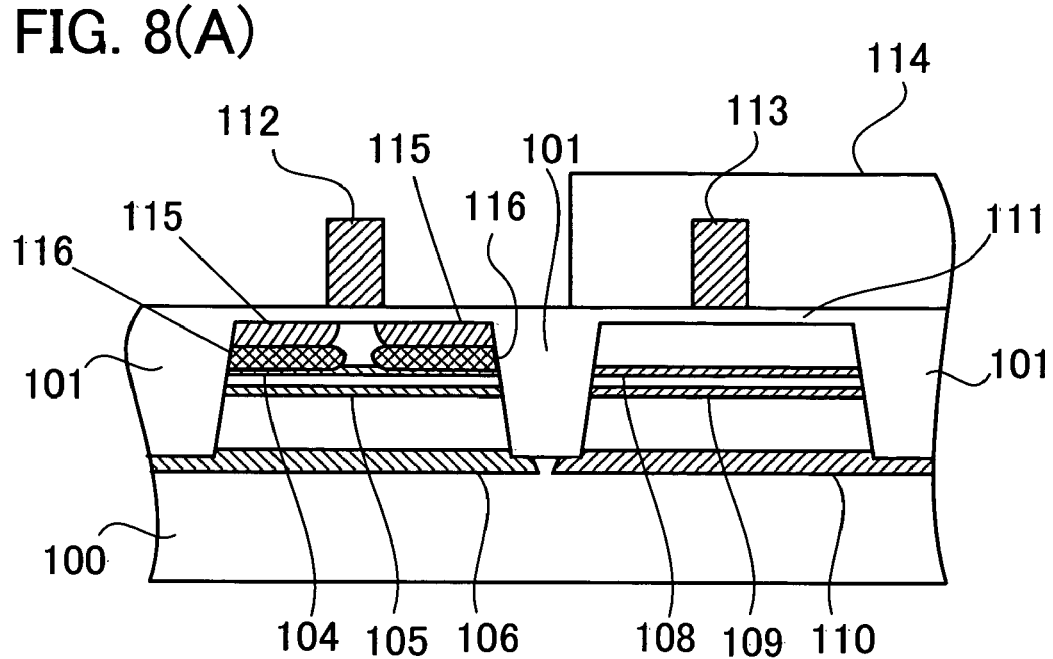
FIGS. 8(A) and 8(B) are sectional views each showing one step included in a semiconductor device fabrication method (III).
Figure 8B:
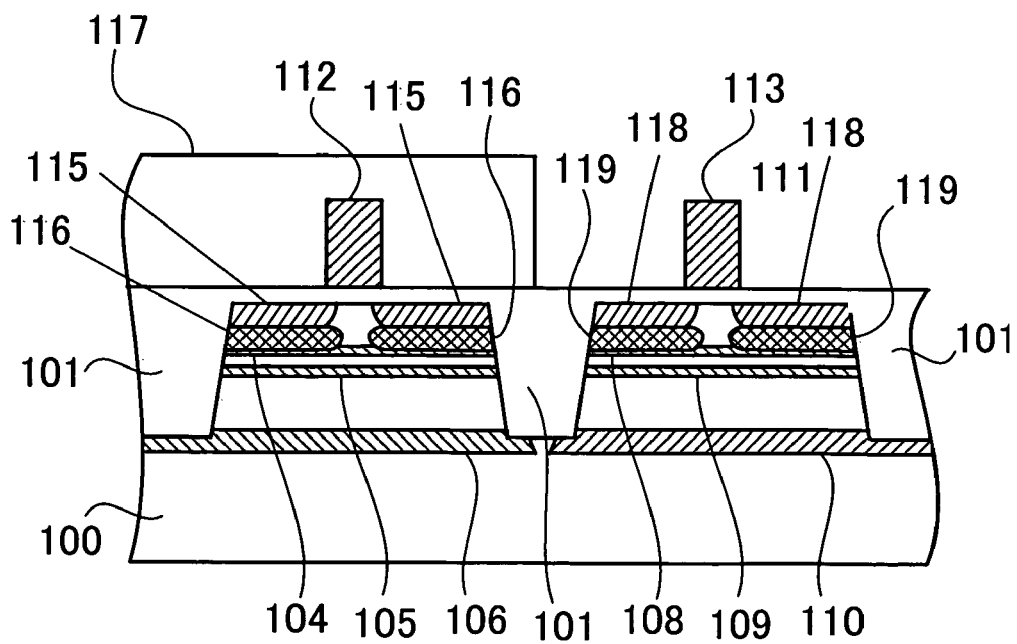

First, isolation films 101 which are embedded, in trenches, for example, 300 nm deep are formed in a wafer (silicon substrate) 100 by, for example, a shallow trench isolation (STI) method (FIG. 6(A)). In FIG. 6(A), it is assumed that the left element area is an n-type transistor formed area and that the right element area is a p-type transistor formed area.

A sacrificial oxide film 102 is then formed on the element areas separated by the isolation films 101 by, for example, a thermal oxidation method. A photoresist film 103 which exposes the n-type transistor formed area and which covers the p-type transistor formed area is formed by photolithography. Ion implantation is performed with the photoresist film 103 as a mask to form p-type impurity diffusion areas 104, 105, and 106 in the n-type transistor formed area in the silicon substrate 100 (FIG. 6(B)).

In this case, the p-type impurity diffusion area 104 is formed by implanting, for example, indium ions (In$^+$) at an acceleration energy level of 60 keV and a dosage level of $1\times10^{13}$cm$^{-2}$.

The p-type impurity diffusion area 105 is formed by implanting, for example, indium ions at an acceleration energy level of 180 keV and a dosage level of $3\times10^{13}$cm$^{-2}$.

The p-type impurity diffusion area 106 is formed by implanting, for example, boron ions (B$^+$) at an acceleration. energy level of 150 keV and a dosage level of $3\times10^{13}$cm$^{-2}$.

Next, a photoresist film 107 which exposes the p-type transistor formed area and which covers the n-type transistor formed area is formed by the photolithography. Ion implantation is performed with the photoresist film 107 as a mask to form n-type impurity diffusion areas 108, 109, and 110 in the p-type transistor formed area in the silicon substrate 100 (FIG. 7(A)).

In this case, the n-type impurity diffusion area 108 is formed by implanting, for example, arsenic ions (As$^+$) at an acceleration energy level of 100 keV and a dosage level of $5\times10^{12}$cm$^{-2}$.

The n-type impurity diffusion area 109 is formed by implanting, for example, arsenic ions at an acceleration energy level of 150 keV and a dosage level of $3\times10^{13}$cm$^{-2}$.

The n-type impurity diffusion area 110 is formed by implanting, for example, phosphorus ions (P$^+$) at an acceleration energy level of 300 keV and a dosage level of $3\times10^{13}$cm$^{-2}$.

After that, the sacrificial oxide film 102 is removed by wet etching with, for example, hydrofluoric acid. A gate insulator 111 is formed on the element areas which get exposed as a result of removing the sacrificial oxide film 102 by, for example, a thermal oxidation method. In this case, the gate insulator 111 is formed by growing a silicon oxide film with a thickness of, for example, 1 nm. A polycrystalline silicon film (not shown) with a thickness of, for example, 100 nm is deposited on the gate insulator 111 by, for example, a chemical vapor deposition (CVD) method. Patterning is then performed on the polycrystalline silicon film by the photolithography and dry etching to form gate electrodes 112 and 113 of the polycrystalline silicon film (FIG. 7(B)).

The gate electrode 112 is formed as a gate electrode of an n-type transistor and the gate electrode 113 is formed as a gate electrode of a p-type transistor.

Next, a photoresist film 11.4 which. exposes the n-type transistor formed area and which covers the p-type transistor formed area is formed by the photolithography. Ion implantation is performed with the photoresist film 114 and the gate electrode 112 as masks to form n-type impurity diffusion areas 115 which are extension areas in the n-type transistor in the silicon substrate 100 on both sides of the gate electrode 112. The n-type impurity diffusion areas 115 are formed by implanting, for example, arsenic ions at an acceleration energy level of 2 keV and a dosage level of $1\times10^{15}$cm$^{-2}$. Ion implantation is then performed with the photoresist film 114 and the gate electrode 112 as masks to form p-type pocket areas 116 in the n-type transistor formed area (FIG. 8(A)).

The p-type pocket areas 116 are formed by implanting, for example, indium ions at an acceleration energy level of 50 keV, at a dosage level of $2\times10^{13}$cm$^{-2}$ and at a tilt angle to the normal of the substrate of 25°.

After that, a photoresist film 117 which exposes the p-type transistor formed, area and which covers the n-type transistor formed area is formed by the photolithography. Boron ions, for example, are implanted at an acceleration energy level of 0.5 keV and a dosage level of $1\times10^{15}$cm$^{-2}$ with the photoresist film 117 and the gate electrode 113 as masks to form p-type impurity diffusion areas 118 which are extension areas in the p-type transistor. Ion implantation is then performed with the photoresist film 117 and the gate electrode 113 as masks to form n-type pocket areas 119 in the p-type transistor formed area (FIG. 8(B)).

The n-type pocket areas 119 are formed by implanting, for example, arsenic ions at an acceleration energy level of 50 keV, at a dosage level of $2\times10^{13}$cm$^{-2}$ and at a tilt angle to the normal of the substrate of 25°.

Figure 9A:
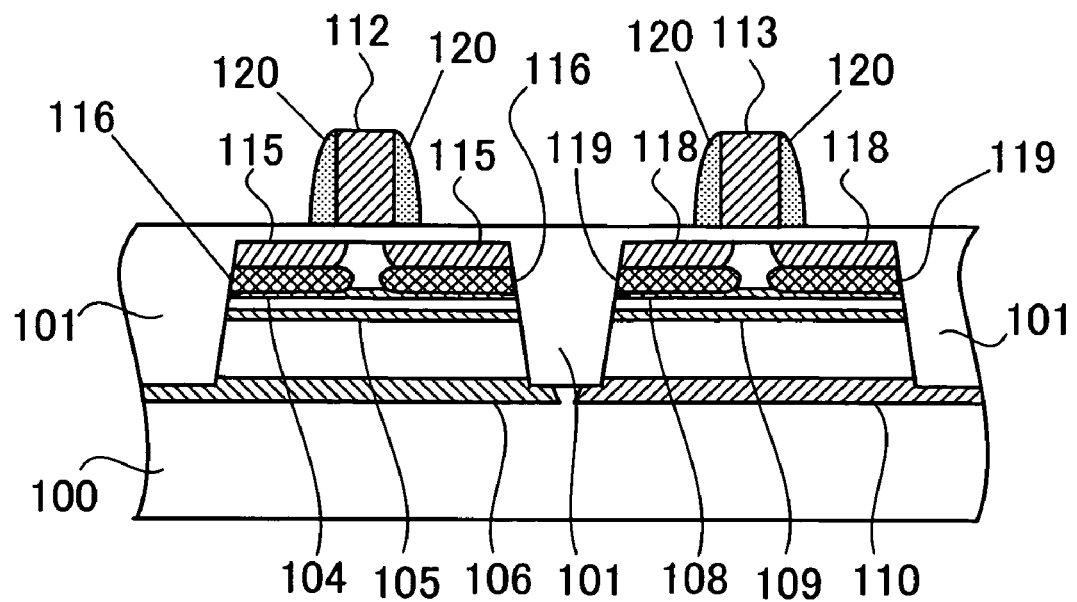
FIGS. 9(A) and 9(B) are sectional views each showing one step included in a semiconductor device fabrication method (IV).
Figure 9B:
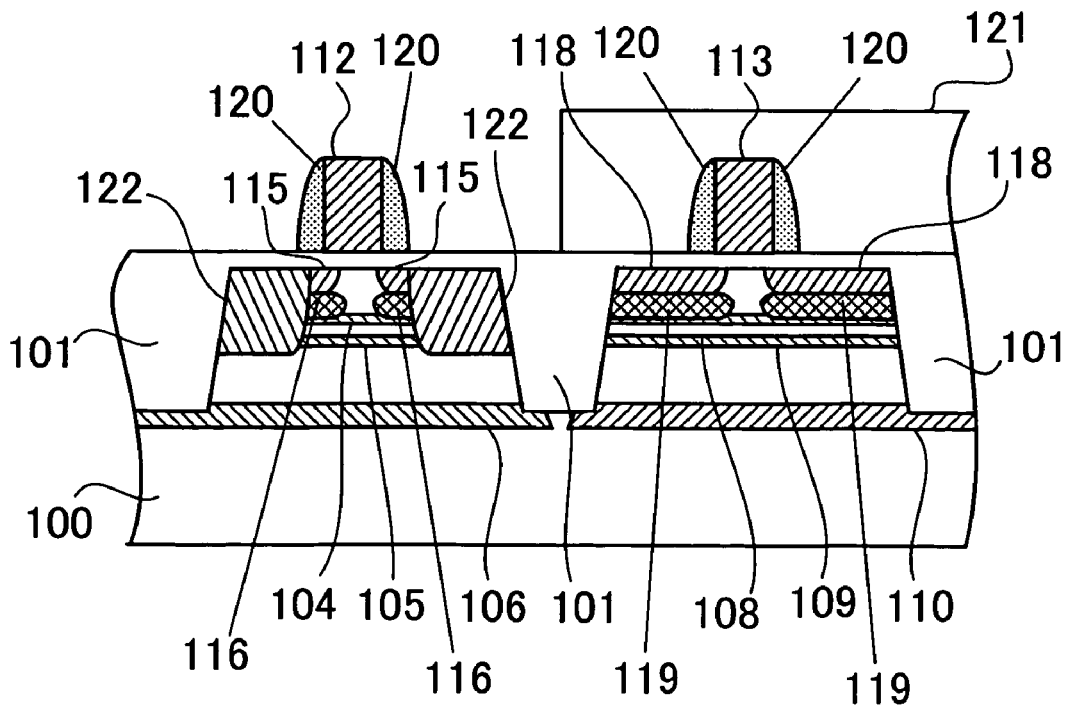
Figure 10A:
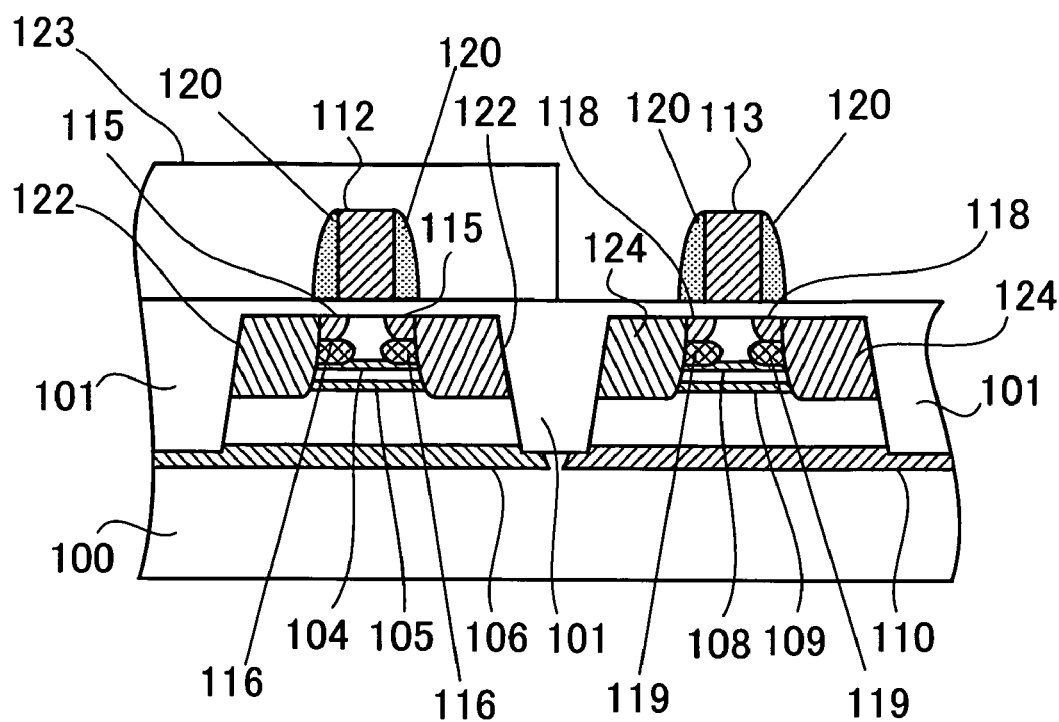
FIGS. 10(A) and 10(B) are sectional views each showing one step included in a semiconductor device fabrication method (V).
Figure 10B:
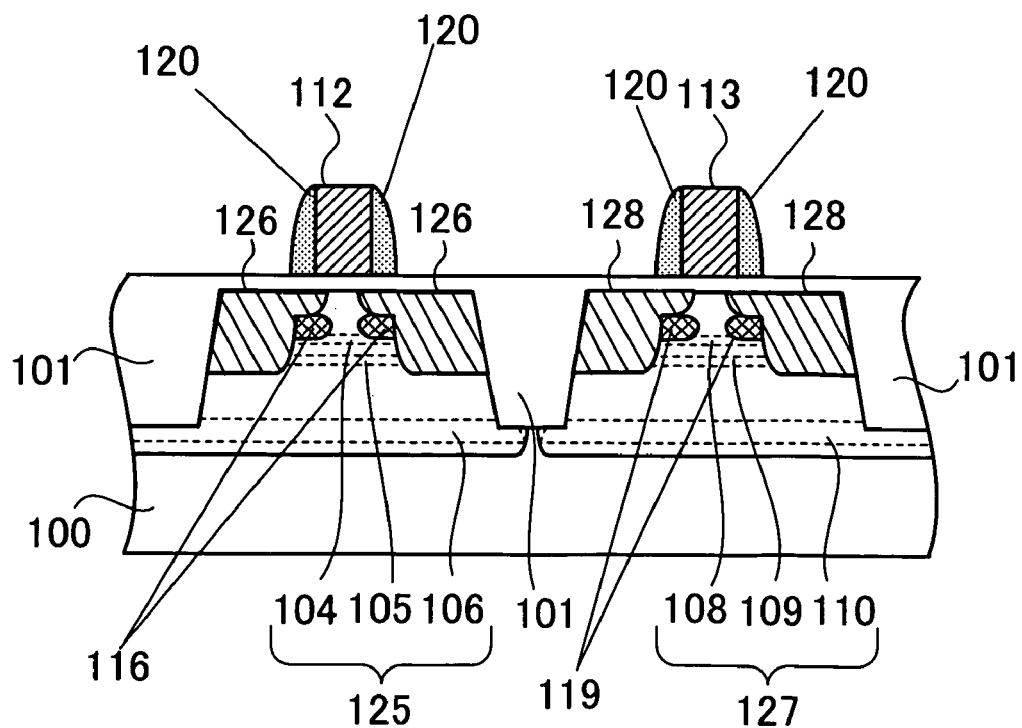

Next, after a silicon oxide film with a thickness of, for example, 100 nm is deposited by, for example, the CVD method, the silicon oxide film is etched back by dry etching to form sidewall insulating films 120 on sidewalls of the gate electrodes 112 and 113 (FIG. 9(A)).

A photoresist film 121 which exposes the n-type transistor formed area and which covers the p-type transistor formed area is then formed by the photolithography. Ion implantation is performed with the photoresist film 121, the gate electrode 112, and the sidewall insulating films 120 as masks to form n-type impurity diffusion areas 122 in the silicon substrate 100 on both sides of the gate electrode 112 (FIG. 9(B)).

The n-type impurity diffusion areas, 122 are formed by implanting, for example, phosphorus ions at an acceleration. energy level of 20 keV and a dosage level of $5\times10^{15} cm^{-2}$.

After that, a photoresist film 123 which exposes the p-type transistor formed area and which covers the n-type transistor formed area is formed by the photolithography. Ion implantation is performed with the photoresist film 123, the gate electrode 113, and the sidewall insulating films 120 as masks to form p-type impurity diffusion areas 124 in the silicon substrate 100 on both sides of the gate electrode 113 (FIG. 10(A)).

The p-type impurity diffusion areas 124 are formed by implanting, for example, boron ions at an acceleration energy level of 5 keV and a dosage level of $5\times10^{15} cm^{-2}$.

Next, heat treatment is performed at, for example, 1000°C. for a short period of time (three seconds, for example) to activate impurities implanted. As a result, a p-type well 125 including the p-type impurity diffusion areas 104, 105, and 106 and an n-type source and drain areas 126 with an extension source and drain structure made up of the n-type impurity diffusion areas 115 and 122 are formed in the n-type transistor formed area. In addition, an n-type well 127 including the n-type impurity diffusion areas 108, 109, and 110 and a p-type source and drain areas 128 with an extension source and drain structure made up of the p-type impurity diffusion areas 118 and 124 are formed in the p-type transistor formed area (FIG. 10(B)).

A silicon nitride film 129 is then formed so that it will cover the gate structures and the entire surface of the silicon substrate 100. After that, a silicon oxide film with a thickness of 400 nm is formed as an interlayer dielectric films 130 by the CVD method and the interlayer dielectric film 130 is planarized by a chemical mechanical polishing (CMP) method.

Next, the source and drain areas 126 and 128 in the transistors are exposed, and contact holes are made to form electrodes. At this time the phase shift mask 10 according to the embodiment of the present invention shown in FIG. 1 is applied. Accordingly, an antireflection coating 131 and a photoresist film 132 are formed on the interlayer dielectric film 130 (FIG. 11(A)).

Figure 11A:
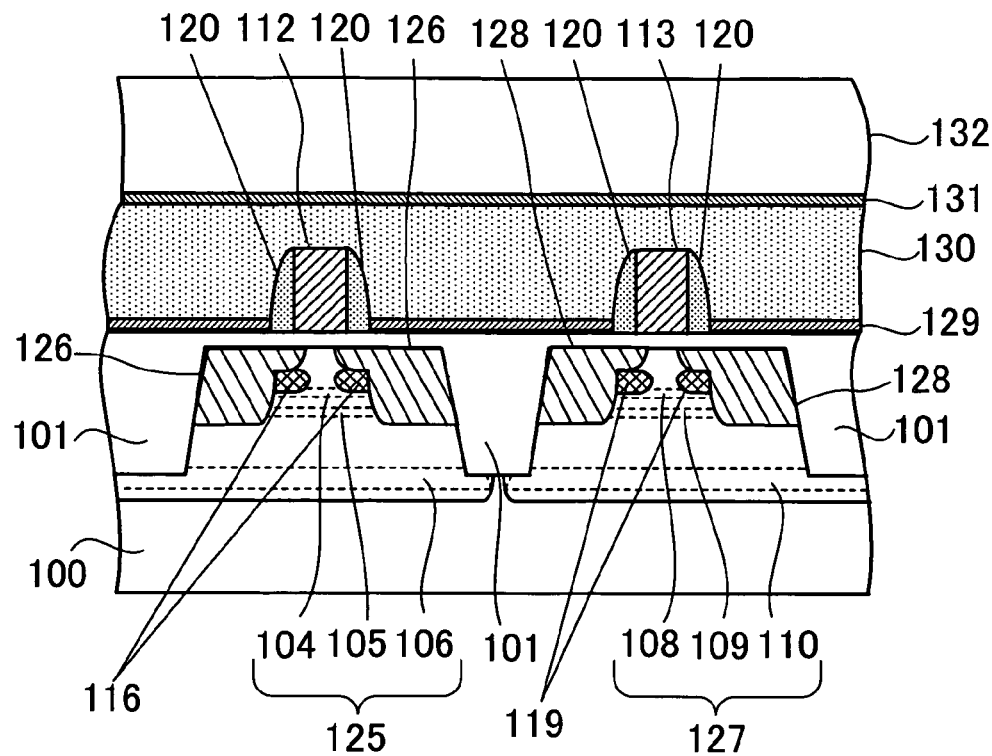
FIGS. 11(A) and 11(B) are sectional views each showing one step included in a semiconductor device fabrication method (VI).

In order to transfer the circuit patterns 20a, exposure is performed on the semiconductor device shown in FIG. 11(A) by using a stepper in which an ArF exima laser is used as a light source and the phase shift mask 10 according to the embodiment of the present invention under the conditions of numerical aperture (NA)=0.70, value of σ=0.70, and amount of exposure=470 J/cm².

Figure 11B:
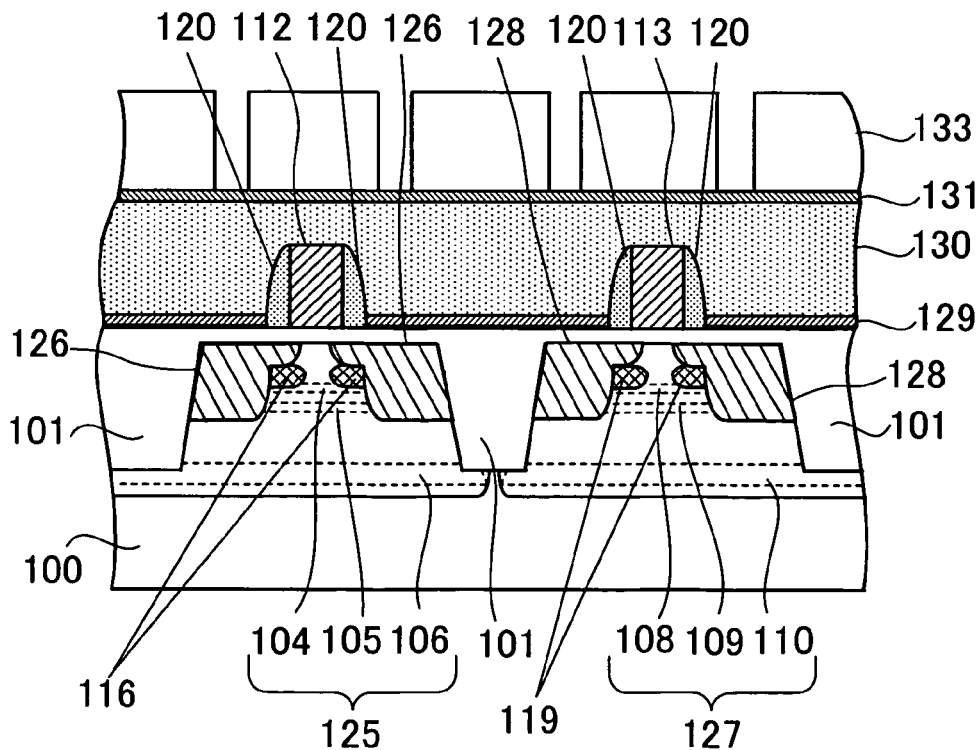
Figure 14A:
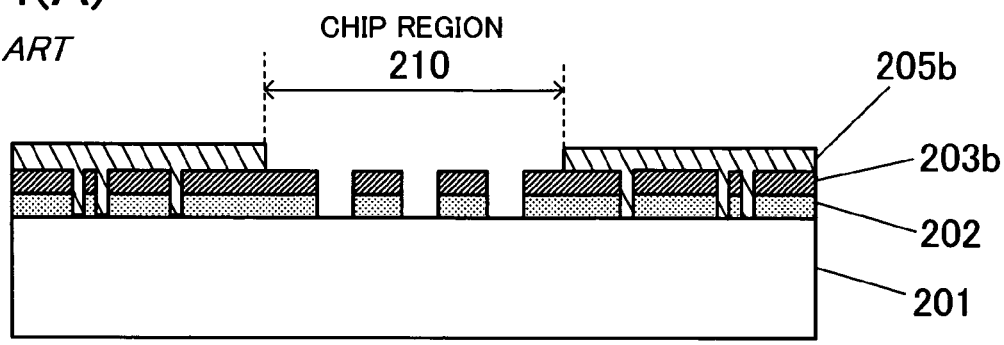
FIGS. 14(A), 14(B), and 14(C) are sectional views each showing one step included in a method (II) for fabricating the conventional phase shift mask.
Figure 14B:
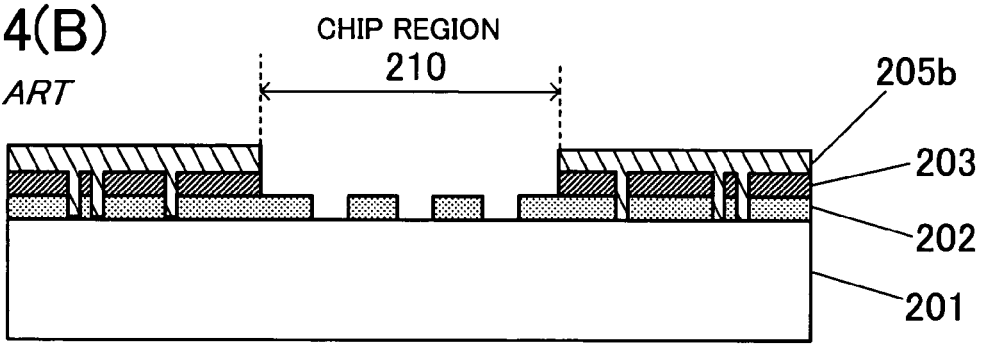
Figure 14C:
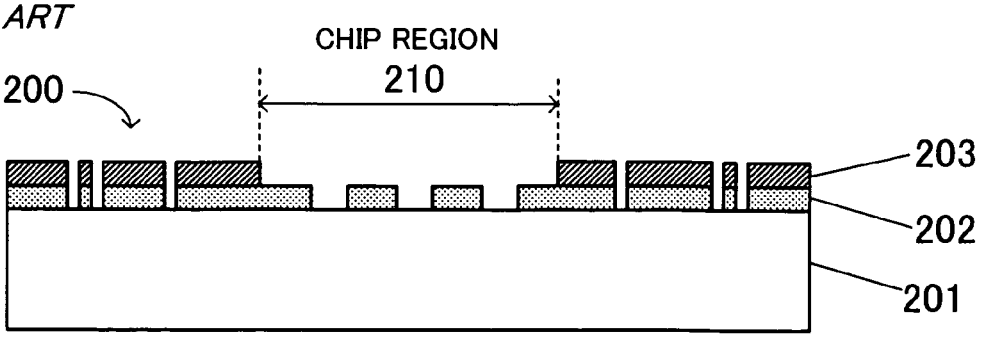

Development is then performed to form a resist pattern 133 (FIG. 11(B)).

At this stage the semiconductor device was inspected with a wafer pattern inspection system (KLA2350 manufactured by KLA). None of the patterns located outside of the device pattern region was transferred and the effectiveness of the phase shift mask 10 according to the embodiment of the present invention was verified.

On the photomask according to the present invention, the non-circuit patterns formed by making the openings in which the phase shift layer is exposed only in the light shielding layer are located around the chip region where the light shielding layer is removed and where the phase shift layer in which the openings corresponding to the circuit patterns transferred onto a chip are made is exposed. This prevents the non-circuit patterns from being transferred onto a wafer by the influence of a flare.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A photomask comprising:
    a transparent substrate;
    a phase shift layer for shifting a phase of exposure light on the transparent substrate;
    a light shielding layer on the phase shift layer;
    a circuit pattern, formed in a chip region, including a first opening through the phase shift layer and exposing the transparent substrate;
    a first non-circuit pattern, formed outside of the chip region and in an area within fifteen millimeters distance from the chip region, including a second opening through the light shielding layer and exposing the phase shift layer; and
    a second non-circuit pattern for adjusting the relative positions of the photomask and an exposure system, formed outside of the chip region and in an area over fifteen millimeters distance from the chip region, including a third opening through the light shielding layer and the phase shift layer and exposing the transparent substrate, wherein:
    in the chip region, the light shielding layer is removed; and
    the transparent substrate under the second opening is wholly covered with the phase shift layer.

2. The photomask according to claim 1, wherein the second opening is a monitor pattern for measuring the accuracy of the position of the circuit patterns.

3. The photomask according to claim 1, wherein the second opening pattern is a pattern for performing alignment at the time of inspecting the circuit patterns for a defect.

4. The photomask according to claim 1, wherein the second opening is a pattern for performing alignment at the time of measuring line width of the circuit patterns.

5. The photomask according to claim 1, wherein the second opening is a target pattern for performing alignment at the time of performing overlay drawing in a mask drawing apparatus.

6. The photomask according to claim 1, wherein the second opening is a pattern for measuring alignment accuracy used at the time of performing overlay drawing in a mask drawing apparatus.

7. The photomask according to claim 1, wherein the second opening is a bar code pattern for mask identification.

8. The photomask according to claim 1, wherein the second opening is a numbering pattern for mask identification.

9. The photomask according to claim 1, wherein each of the phase shift layer and the light shielding layer is made of a material which can selectively be etched.

10. The photomask according to claim 1, wherein the phase shift layer is a MoSiON film.

11. The photomask according to claim 1, wherein the light shielding layer is made up of a chromium film and a chromium oxide film.

12. A method for fabricating a photomask comprising:
forming a phase shift layer shifting a phase of exposure light and a light shielding layer in order on a transparent substrate;
forming a first opening in the light shielding layer in a chip region;
forming a second opening in the light shielding layer in a non-circuit region outside of the chip region and in an area within fifteen millimeters distance from the chip region;
forming a third opening in the light shielding layer in the non-circuit region outside of the chip region and in an area over fifteen millimeters distance from the chip region;
forming a resist pattern covering the second opening and exposing the chip region and the third opening;
etching the phase shift layer using the resist pattern and the light shielding layer as masks; and
removing the light shielding layer in the chip region using the resist pattern as a mask;
wherein the transparent substrate under the second opening is wholly covered with the phase shift layer.

13. The method according to claim 12, wherein:
the phase shift layer is etched with the resist pattern as a mask; and
the light shielding layer in the chip region is removed with the resist pattern as a mask.

14. The method according to claim 13, wherein a fiducial pattern for adjusting the relative positions of the photomask and an exposure system is included in the non-chip region of the photomask.

15. The method according to claim 12, wherein:
the resist pattern is formed to include an opening in areas corresponding to a non-circuit pattern which needs the high light transmittance.

16. The method according to claim 15, wherein the non-circuit pattern which needs the high light transmittance is a fiducial pattern for adjusting the relative positions of the photomask and an exposure system.

17. A method for fabricating a semiconductor device comprising:
forming a phase shift layer shifting a phase of exposure light and a light shielding layer in order on a transparent substrate;
forming a first opening in the light shielding layer in a chip region;
forming a second opening in the light shielding layer in a non-circuit region outside of the chip region and in an area within fifteen millimeters distance from the chip region;
forming a third opening in the light shielding layer in the non-circuit region outside of the chip region and in an area over fifteen millimeters distance from the chip region;
forming a resist pattern covering the second opening and exposing the chip region and the third opening;
etching the phase shift layer using the resist pattern and the light shielding layer as masks;
removing the light shielding layer in the chip region using the resist pattern as a mask; and
after removing the light shielding layer in the chip region, performing a exposure process to a resist film over a semiconductor substrate using the transparent substrate as a photomask;
wherein the transparent substrate under the second opening is wholly covered with the phase shift layer.

* * * * *